(12) United States Patent
Hongo et al.

(10) Patent No.: US 6,931,239 B2
(45) Date of Patent: Aug. 16, 2005

(54) PEAK LIMITER AND MULTI-CARRIER AMPLIFICATION APPARATUS

(75) Inventors: Naoki Hongo, Tokyo (JP); Yoichi Okubo, Tokyo (JP); Masaki Suto, Tokyo (JP); Masato Horaguchi, Tokyo (JP); Toshio Takada, Tokyo (JP); Tetsuhiko Miyatani, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 438 days.

(21) Appl. No.: 10/205,563

(22) Filed: Jul. 26, 2002

(65) Prior Publication Data

US 2003/0022639 A1 Jan. 30, 2003

(30) Foreign Application Priority Data

Jul. 30, 2001 (JP) .......................................... 2001-229738
Mar. 5, 2002 (JP) .......................................... 2002-058974

(51) Int. Cl.$^7$ ............................... H04B 1/02; H04B 1/04
(52) U.S. Cl. ...................... 455/103; 455/114.3; 375/296
(58) Field of Search ............................... 455/103, 114.2, 455/114.3, 126, 127.1, 127.2, 91; 375/295, 296, 297

(56) References Cited

U.S. PATENT DOCUMENTS

| | | | | |
|---|---|---|---|---|
| 5,710,990 A | * | 1/1998 | Long et al. | 455/103 |
| 5,751,705 A | * | 5/1998 | Sato | 370/335 |
| 6,144,694 A | * | 11/2000 | Uta et al. | 375/146 |
| 6,154,659 A | | 11/2000 | Jalali et al. | |
| 6,236,864 B1 | | 5/2001 | McGowan et al. | |
| 2003/0179833 A1 | * | 9/2003 | Porco et al. | 375/297 |

FOREIGN PATENT DOCUMENTS

| | | |
|---|---|---|
| EP | 0743768 | 11/1996 |
| JP | 2000244452 | 9/2000 |

* cited by examiner

*Primary Examiner*—Nguyen T. Vo
(74) *Attorney, Agent, or Firm*—Bacon & Thomas, PLLC (57) ABSTRACT

A peak limiter for use in a system for amplifying a multi-carrier signal receives a baseband signal of each carrier of the multi-carrier signal. The multi-carrier signal is computationally estimated to have carriers combined in an RF band, and obtains power information of the multi-carrier signal to limit an amplitude of the baseband signal based on the power information of the estimated multi-carrier signal to thereby provide peak-limited baseband signals. Thus, the distortion generated by performing the unnecessary peak limitation can be effectively prevented to thereby improve the reliability of the entire system.

12 Claims, 11 Drawing Sheets

CARRIER

FIG.2B

CARRIER

FIG.2C

CARRIER

FIG.2D

MULTI-CARRIER

BACK OFF METHOD

FIG. 7B

FEED FORWARD METHOD
AND PREDISTORTION METHOD

PEAK LIMITER AND MULTI-CARRIER AMPLIFICATION APPARATUS

FIELD OF THE INVENTION

The present invention relates to a peak limiter and a multi-carrier amplification apparatus for use in a system for amplifying a multi-carrier signal, e.g., a base station of a mobile communications system employing a W-CDMA technique; and, more particularly, to a peak limiter and a multi-carrier amplification apparatus capable of enhancing power efficiency of the amplification system.

BACKGROUND OF THE INVENTION

In general, a relatively high transmission power level is required for proper communications between a remote mobile station and a base station of a mobile communications system employing, e.g., W-CDMA (Wideband Code Division Multiple Access) scheme. In such a case, communication signals sometimes need be highly amplified at a transmission end, e.g., the base station.

An amplifier, which is an analog device, generally exhibits nonlinear input/output characteristics. Specifically, the output power of the amplifier becomes almost constant even while an input power of the amplifier increases beyond an amplification limit referred to as a saturation point. Such nonlinear output leads to a nonlinear distortion in the output signal.

Typically, spurious emissions out of a band signal are suppressed to a low power level by a band-pass filter before the transmission signal is amplified. However, after the transmission signal is amplified at the amplifier, the amplified signal exhibits a nonlinear distortion, entailing a leak of a part of the amplified signal into adjacent channels. Since the transmission power level at the base station can be high as described above, the leakage power level to the adjacent channels need be suppressed below a certain strictly defined level. To that end, techniques for reducing ACP (Adjacent Channel leakage Power) have been used in the conventional amplifiers.

In order to reduce the ACP, there are employed various methods such as a back-off, a feed-forward and a predistortion method for the amplifier.

Figure 7A:
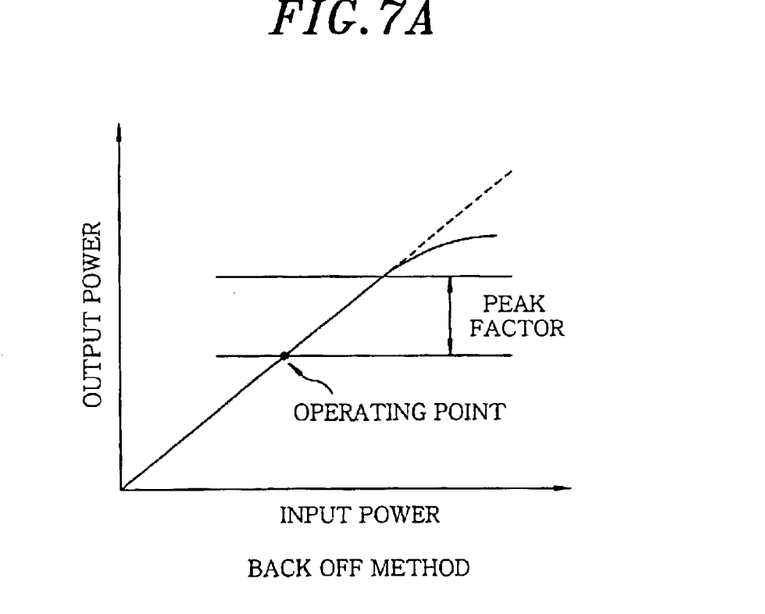
FIG. 7A describes an amplifier control scheme in accordance with a back-off method.
Figure 7B:
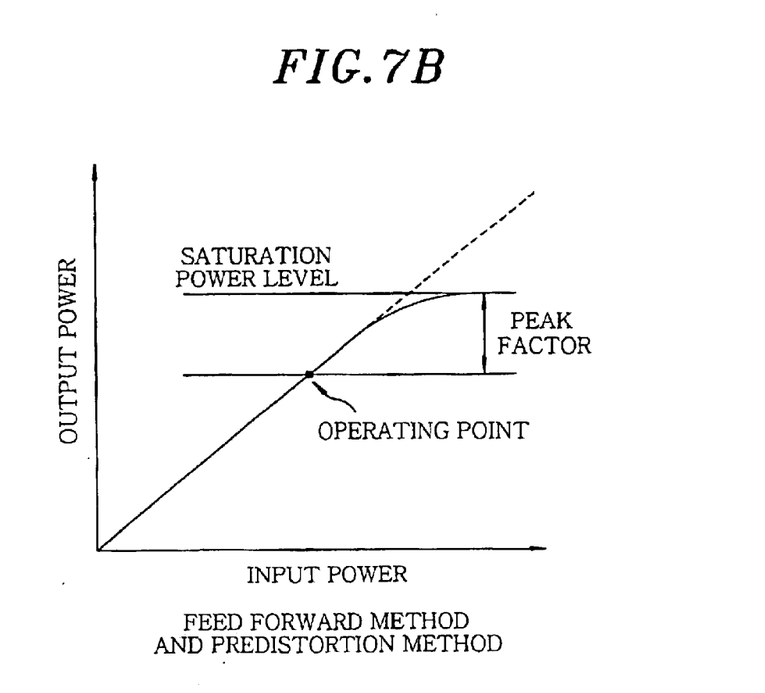
FIG. 7B illustrates an amplifier control scheme in accordance with a feed-forward method and a predistortion method.

Referring to FIGS. 7A and 7B, there are shown characteristics of the amplifier and operation characteristics of the methods described above. FIGS. 7A and 7B show control characteristics of a back-off method and of a feed-forward and a predistortion method, respectively.

The back-off method prevents a nonlinear distortion from being generated by limiting an operation range of the amplifier within a linear region thereof by way of lowering an operating point. To be specific, the operating point of the back-off method is set at a point below a maximum output power level maintaining the linearity, for example, at a point lower than the maximum level by as much as the magnitude of the output power corresponding to a peak factor of an input signal of the amplifier, as shown in FIG. 7A.

Figure 8:
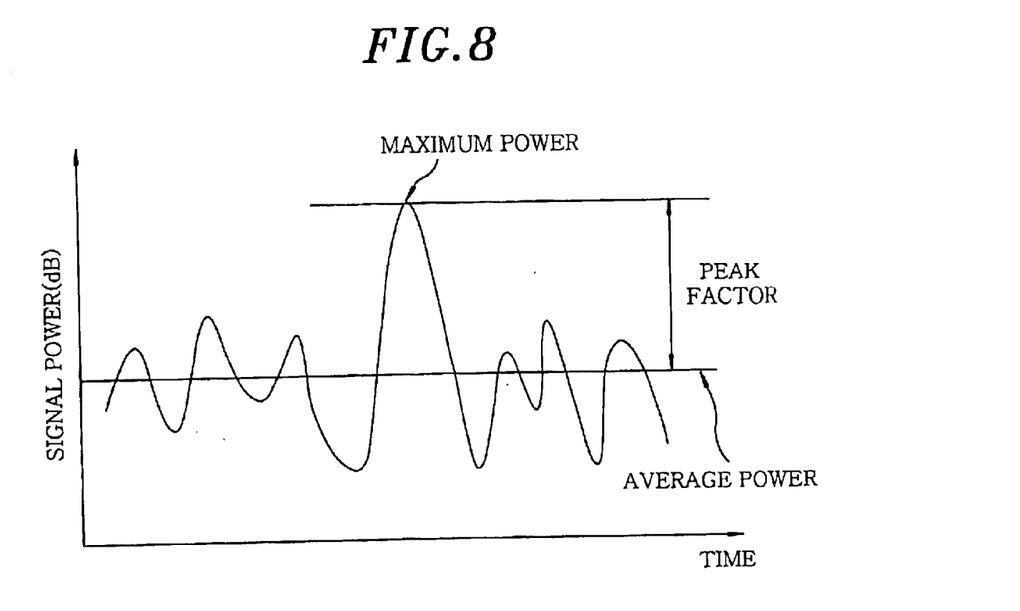
FIG. 8 generally represents a peak factor of an input signal.

The peak factor is the ratio of the maximum power level of the input signal of the amplifier to the average power level thereof as shown in FIG. 8. That is, the peak factor becomes smaller as the difference between the maximum power level and the average power level is reduced.

On the other hand, in the feed-forward method, distortion compensation is performed by subtracting a distortion component amplified in an error amplifier from an output of a main amplifier containing therein a desired signal and the distortion component.

In the predistortion method, a predistortion component is introduced to an input signal of an amplifier in order to compensate the distortion to be produced in the output of the amplifier. The predistortion component is determined based on the characteristics opposite to the nonlinear characteristics to be generated by, e.g., an AM/AM and an AM/PM conversion process in the amplifier.

As described above, the feed-forward and the predistortion method can be used in effectively removing the distortion generated by an amplifier. Therefore, as shown in FIG. 7B, an operating point in either method can be set at a point below a saturation output power level of the amplifier, the operating point being set lower than the saturation level by the magnitude of the output power corresponding to a peak factor, as shown in FIG. 7B. Therefore, the operating point of the feed-forward and the predistortion method can be set higher than that of the back-off method.

Thus, the feed-forward and the predistortion method are widely used since it is possible to improve the power efficiency of the system by employing them. This higher operating point leads to a greater output power to thereby improve the power efficiency. The power efficiency of an amplifier also greatly depends on the magnitude of the peak factor of the input signal of the amplifier.

A larger peak factor requires a greater size of a transistor to be used in the power amplifier circuit. Moreover, the operating point of the amplifier should be lowered greatly to avoid the saturation of the output power level, so that the ratio of the output power to a DC input power of the amplifier is reduced.

For these reasons, in order to improve the power efficiency of the amplifier, the peak factor need be controlled to be as small as possible. To this end, a peak limiter is introduced, e.g., at a front end of the amplifier to provide a maximum power ("peak") limited signal as an input signal of the amplifier.

Figure 10:
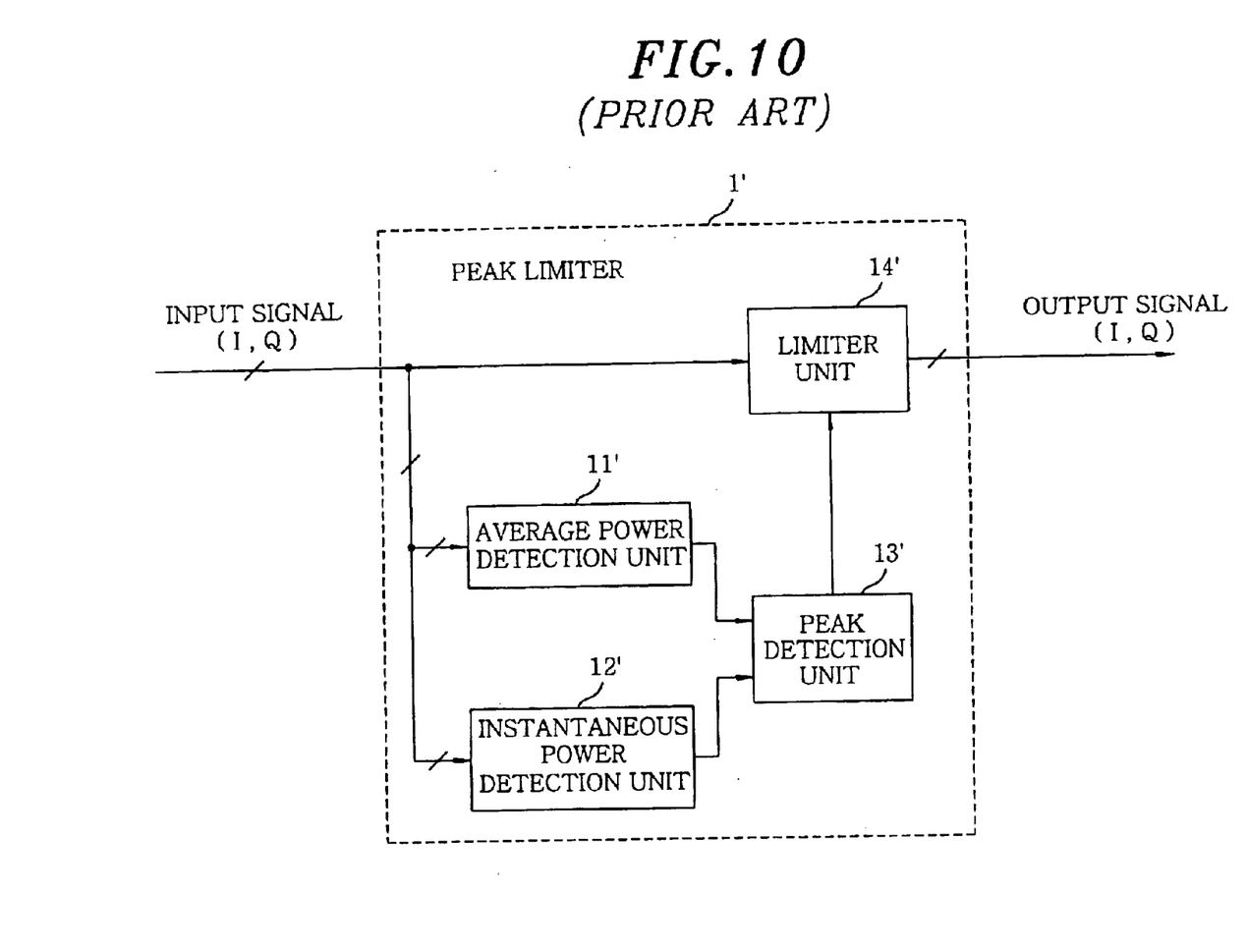
FIG. 10 offers a block diagram of a conventional peak limiter.

A conventional peak limiter will now be described hereinafter with reference to FIG. 10. Referring to FIG. 10, there is provided a block diagram showing an exemplary structure of a conventional peak limiter.

The conventional peak limiter 1' includes an average power detection unit 11', an instantaneous power detection unit 12', a peak detection unit 13' and a limiter unit 14' as shown in FIG. 10.

The average power detection unit 11' detects the average power of an input signal (I, Q) of the peak limiter 1' to thereby output average power information.

The instantaneous power detection unit 12' detects instantaneous power levels of the input signal (I, Q) to output instantaneous power information.

The peak detection unit 13' detects whether a peak to be power-limited exists in the input signal (I, Q). Specifically, the peak detection unit 13' calculates instantaneous-to-average power ratios of the input signal, an instantaneous-to-average power ratio representing the ratio of an instantaneous power level from the instantaneous power detection unit 12' to an average power level from the average power detection unit 11'. Then, the peak detection unit 13' detects whether there exists an instantaneous-to-average power ratio exceeding a predetermined peak threshold value. The portions of the input signal corresponding to the instantaneous-to-average power ratio exceeding the peak threshold value are determined as a peak to be power-limited and the detection result is outputted as peak detection information to the limiter unit 14'. The predetermined peak threshold value corresponds to the peak factor considered in determining the operating point in FIG. 7B.

The limiter unit 14' limits the power of the input signal (I, Q) in response to the peak detection information. To be specific, when a peak having the instantaneous-to-average power ratio exceeding the peak threshold value is detected by the peak detection unit 13', the limiter unit 14' in response thereto limits the power of the peak not to exceed a predetermined level. Therefore, the input signal (I, Q) is controlled to have a maximum power lowered down to the predetermined level (limit power). Thus peak-limited input signal (I, Q) is provided from the limiter unit 14' as an output signal (I, Q) thereof.

In general, the input signal (I, Q) fed to the peak limiter 1' is a baseband signal which is not band-limited yet. The peak limitation by the peak limiter 1' is performed for such input signal (I, Q) and then filtering by a low pass filter (not shown) is carried out therefor, so that distortion generation can be prevented. Moreover, since the peak of the input signal is limited by the peak limiter 1', the peak factor of the input signal can be made to be small, which can lead to a high operating point of the amplifier to improve the power efficiency thereof.

The peak factor of a signal normally becomes greater after being subjected to band limitation. This is because the input square wave rounded after band limitation, rendering certain portions of the peaks of the signal to increase. For this reason, the peak threshold value set in the peak detection unit 13' need be determined to be conservatively low by considering the peak factor increment after the band limitation.

Figure 11:
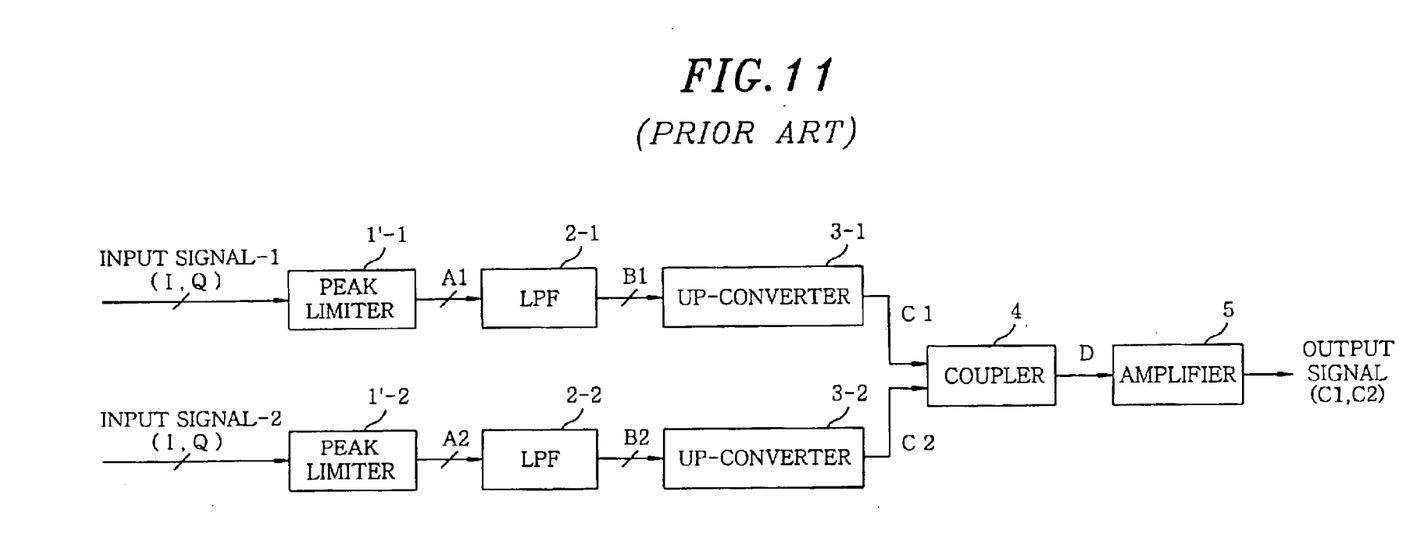
FIG. 11 depicts a schematic block diagram of a conventional multi-carrier amplification apparatus.

Referring to FIG. 11, there is illustrated a schematic block diagram of a conventional multi-carrier amplification apparatus employing the prior art peak limiter 1' shown in FIG. 10, wherein it is assumed that there exist two carriers in a multi-carrier signal.

In the conventional multi-carrier amplification apparatus, provided for the two carriers are their respective peak limiters 1'-1 and 1'-2, each for peak limiting its corresponding input signal (I, Q) −1 or −2, filters 2-1 and 2-2 for performing the band limitation of respective peak-limited signals A1 and A2 and up-converters 3-1 and 3-2 for up-converting the respective band-limited signals B1 and B2 to RF band (high frequency modulation) to provide carrier signals C1 and C2. The conventional multi-carrier amplification apparatus further includes a coupler 4 for coupling the carrier signals C1 and C2 to output a multi-carrier signal D and an amplifier 5 for amplifying the multi-carrier signal D to generate an output signal (C1, C2).

To be specific, the peak limiters 1'-1 and 1'-2 in the conventional multi-carrier amplification apparatus calculate the instantaneous-to-average power ratios of their corresponding input signals to output the peak-limited signals A1 and A2 in a manner described with respect to the peak limiter 1' shown in FIG. 10. The filters 2-1 and 2-2 perform filtering on the peak-limited input signals A1 and A2 to output the band-limited signals B1 and B2. The up-converters 3-1 and 3-2 up-convert the band-limited signals B1 and B2 to the radio frequency (RF) band to thereby output the up-converted RF modulated signals (carrier signals) C1 and C2. Then, the coupler 4 combines the carrier signals C1 and C2 to output a multi-carrier signal D. The amplifier 5 amplifies the multi-carrier signal D to generate the amplified multi-carrier signal as the output signal (C1, C2) thereof.

As described, since peak factors of the input signals (I, Q) are reduced by the peak limiters 1'-1 and 1'-2, a peak factor of the multi-carrier signal D can be also suppressed. As a result, the operating point of the amplifier 5 can be raised to enhance the power efficiency thereof.

Japanese Patent Laid Open No. 2000-244452 entitled "CDMA wireless base station" discloses a technique capable of reducing the generation of distortion during amplifying a multi-carrier signal.

In the above CDMA wireless base station of the prior art, a limit level of a baseband input signal is set to be high in a case where a modulation signal having a large number of carriers and great transmission power is inputted to a common amplifier. In other cases, however, the limit level of the baseband input signal is set to be low. Through such control, the distortion generation can be lowered in case of having a large number of carriers and great transmission power and an error rate at a reception end can be reduced in case of a small number of the carriers. Moreover, since an amplifier having a low power consumption can be employed by adaptively changing the limit level, the overall power consumption of the entire amplification apparatus can also be reduced.

However, in the prior art peak limiter and multi-carrier amplification apparatus, the peak limitation is carried out with respect to the individual input signal based on a peak factor and a peak threshold value of each input signal; and the peak-limited signals are combined after band limitation. As a result, the peak factor of the multi-carrier signal outputted from the coupler 4 becomes generally greater than that of each of the peak-limited signals A1 and A2, so that it is difficult to properly adjust the predetermined peak threshold value in order to obtain a desired peak factor for the input signal fed to the amplifier 5. Therefore, the peak threshold value is predetermined conservatively low for the sake of safety, so that effective peak limitation can not be performed. For example, a peak factor of a multi-carrier signal having 2 to 4 carriers in W-CDMA can be greater by 2–6 dB than that of a multi-carrier signal having one carrier.

Moreover, even in a case where an actual power of the multi-carrier signal coupled at the coupler 4 is small, the peak limitation is performed on individual input signal if instantaneous-to-average power ratios thereof are greater than the predetermined peak threshold value, resulting in unnecessary peak limitation, which in turn deteriorates the modulation accuracy.

SUMMARY OF THE INVENTION

It is, therefore, an object of the present invention to provide a peak limiter and a multi-carrier amplification apparatus capable of effectively performing peak limitation in order to precisely obtain a desired peak factor of an input signal of an amplifier to thereby enhance the power efficiency thereof.

In accordance with a preferred embodiment of the present invention, there is provided a peak limiter for use in a system for amplifying a multi-carrier signal, wherein the peak limiter, responsive to baseband signals of carriers of the multi-carrier signal, computationally estimates the multi-carrier signal by combining the baseband signals in an RF band to obtain power information of the estimated multi-carrier signal, and limits an amplitude of each of the baseband signals based on the power information of the estimated multi-carrier signal to thereby provide peak-limited baseband signals.

In accordance with another preferred embodiment of the present invention, there is provided a peak limiter for use in a system for amplifying a multi-carrier signal, including: an instantaneous power detection unit for receiving a baseband signal of each carrier and estimating the multi-carrier signal to provide instantaneous power levels of the estimated multi-carrier signal; an average power detection unit for providing an average power level of the estimated multi-carrier signal; a peak detection unit, responsive to the average power level and the instantaneous power level, for calculating instantaneous-to-average power ratios, an instantaneous-to-average power ratio being a ratio of an instantaneous power level to the average power level, and comparing the instantaneous-to-average power ratios with a predetermined peak factor threshold value to thereby detect a peak to be peak-limited and provide peak detection information representing the peak; and a limiter unit for limiting an amplitude of the baseband signal in response to the peak detection information to provide a peak-limited baseband signal.

In accordance with still another preferred embodiment of the present invention, there is provided a peak limiter for use in a system for amplifying a multi-carrier signal, including: an instantaneous power detection unit for receiving a baseband signal of each carrier and estimating the multi-carrier signal to provide instantaneous power levels of the estimated multi-carrier signal; a peak detection unit, responsive to the instantaneous power levels, for comparing the instantaneous power levels with a predetermined peak threshold value to thereby detect a peak to be peak-limited and providing peak detection information representing the peak; and a limiter unit for limiting an amplitude of the baseband signal in response to the peak detection information to provide a peak-limited baseband signal.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The inventive features of the present invention can be realized by any other circuits or apparatus than those described in the preferred embodiments of the invention as long as they can realize such features. Further, some or all of the functions thereof may be implemented by software. In addition, each of certain functional elements of the system can be implemented by a plurality of circuits or a multiplicity of such functional elements of the system can be configured in a single circuit.

Figure 1:
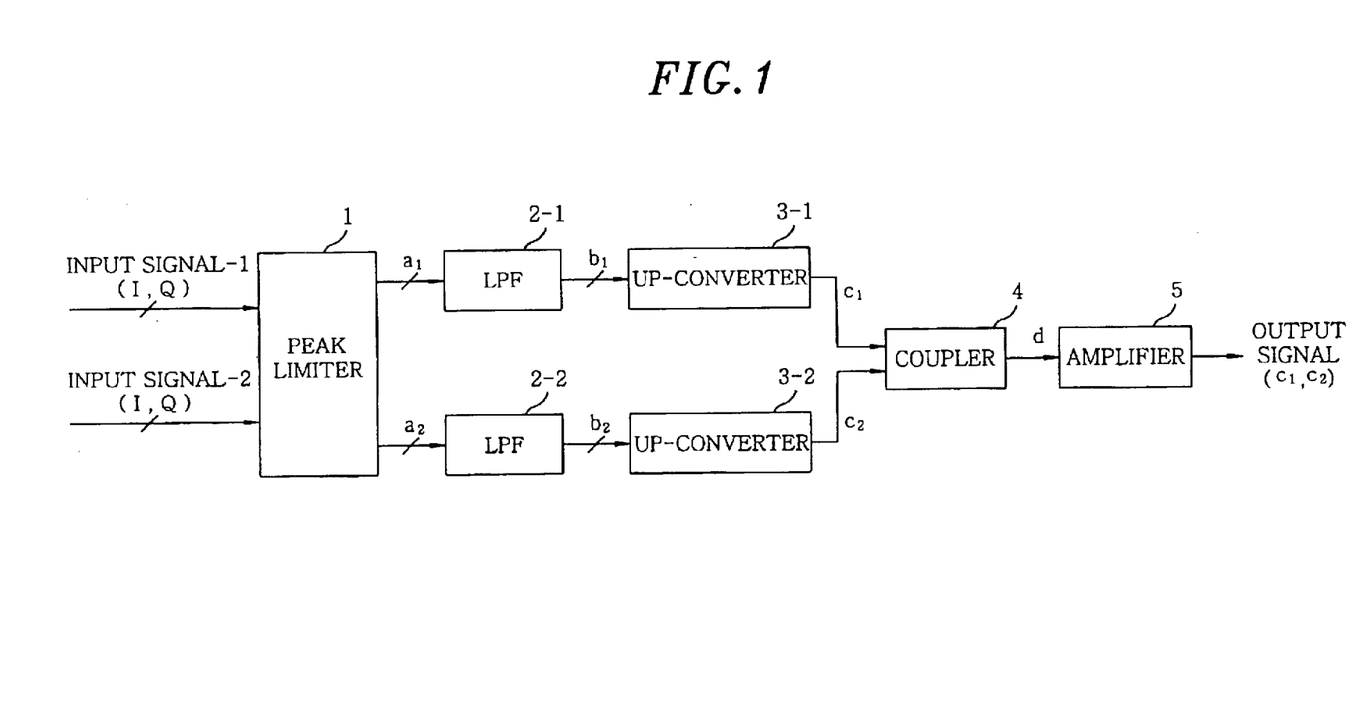
FIG. 1 describes a block diagram of a multi-carrier amplification apparatus in accordance with the present invention.

Referring to FIG. 1, there is illustrated a block diagram of a multi-carrier amplification apparatus in accordance with the present invention, wherein like reference numerals are used to represent like parts of the conventional multi-carrier amplification apparatus shown in FIG. 11.

The multi-carrier amplification apparatus in accordance with the present invention includes low-pass filters (LPF) 2-1 and 2-2 for filtering respective peak-limited signals a1 and a2 (two input signals are assumed in FIG. 1), up-converters 3-1 and 3-2 for up-converting, i.e., modulating, respective band-pass filtered signals b1 and b2 with radio frequencies. The multi-carrier amplification apparatus also includes a coupler 4 for coupling respective carrier signals c1 and c2 to output a multi-carrier signal d and an amplifier 5 for amplifying the multi-carrier signal d to provide an output signal (c1, c2). The multi-carrier amplification apparatus in accordance with the present invention further includes a common peak limiter 1 for the two input baseband signals, in contrast to the two conventional peak limiters 1'-1 and 1'-2 for two input signals shown in FIG. 11.

Since the filters 2-1 and 2-2, the up-converters 3-1 and 3-2, the coupler 4 and the amplifier 5 of the multi-carrier amplification apparatus in FIG. 1 are functionally identical to those of the conventional multi-carrier amplification apparatus shown in FIG. 11, the detailed description thereof will not be repeated.

The detailed explanation of the peak limiter 1 shown in FIG. 1 in accordance with the present invention will be now described.

Figure 2A:
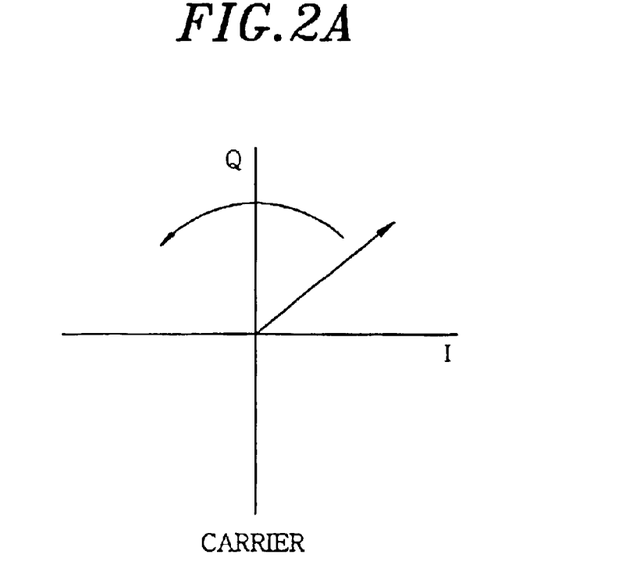
FIGS. 2A to 2C illustrate diagrams for explaining various carrier signals represented in a complex space, respectively.
Figure 2B:
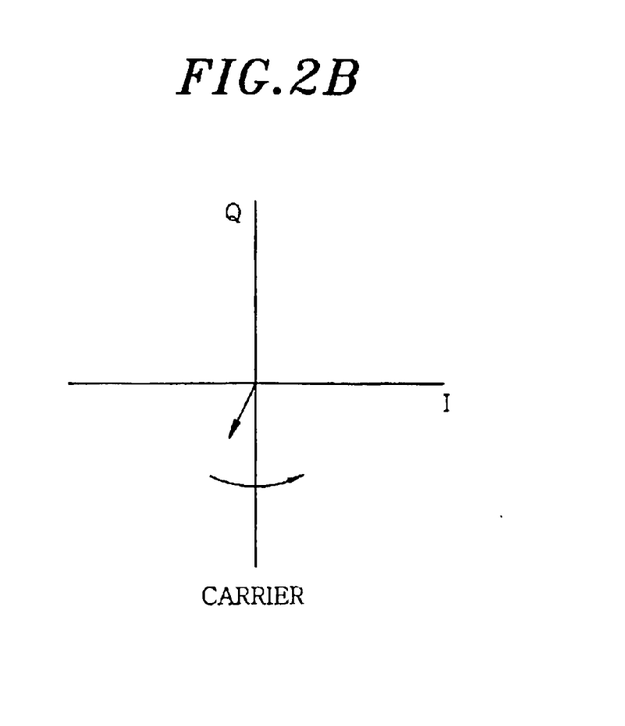
Figure 2C:
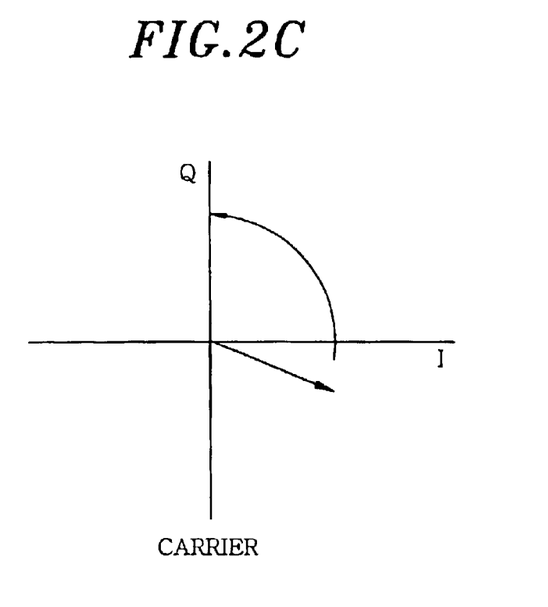
Figure 2D:
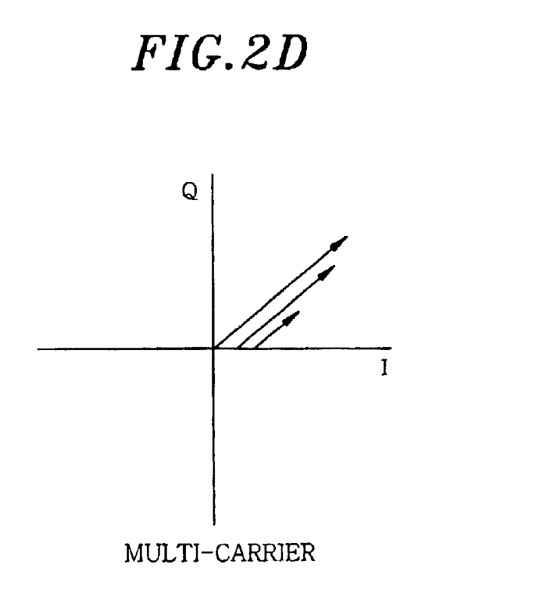
FIG. 2D provides a diagram for describing a multi-carrier signal in a complex space after combining individual carrier signals.

Referring to FIGS. 2A to 2C, there are provided diagrams for exemplifying various carrier signals represented in a complex space, respectively. FIG. 2D provides a diagram for describing a multi-carrier signal in a complex space after combining the carrier signals.

Generally, in the transmission of multi-carrier signal, a plurality of input signals are modulated into carriers having certain frequency differences therebetween. Then, respective carrier signals rotate in the complex space with their different specific periods and a phase of each carrier signal is being changed depending on the passage of time as shown in FIGS. 2A to 2C.

Therefore, if the carrier signals of a multi-carrier signal are out of phase, the carrier signals are cancelled out by each other and thus a power level of the multi-carrier signal may not be so great. On the other hand, the power level of the multi-carrier signal becomes larger as the carrier signals become more inphase. Therefore, an instantaneous power of the multi-carrier signal can become great in case the phases of the carrier signals are aligned as shown in FIG. 2D. In FIG. 2D, the carrier signals are drawn by offsetting the origin of the vectors for the sake of illustration.

Thus, the peak limiter in accordance with the present invention performs no peak limitation even on a carrier having a large power if the phases of the carriers are different from each other and thus the power of the multi-carrier signal is not great.

The present invention provides a peak limiter capable of calculating an instantaneous power level of the multi-carrier signal at an instant that the phases of the carrier signals included therein become coincident with each other and thereby detecting the timing of peak limitation.

Figure 3:
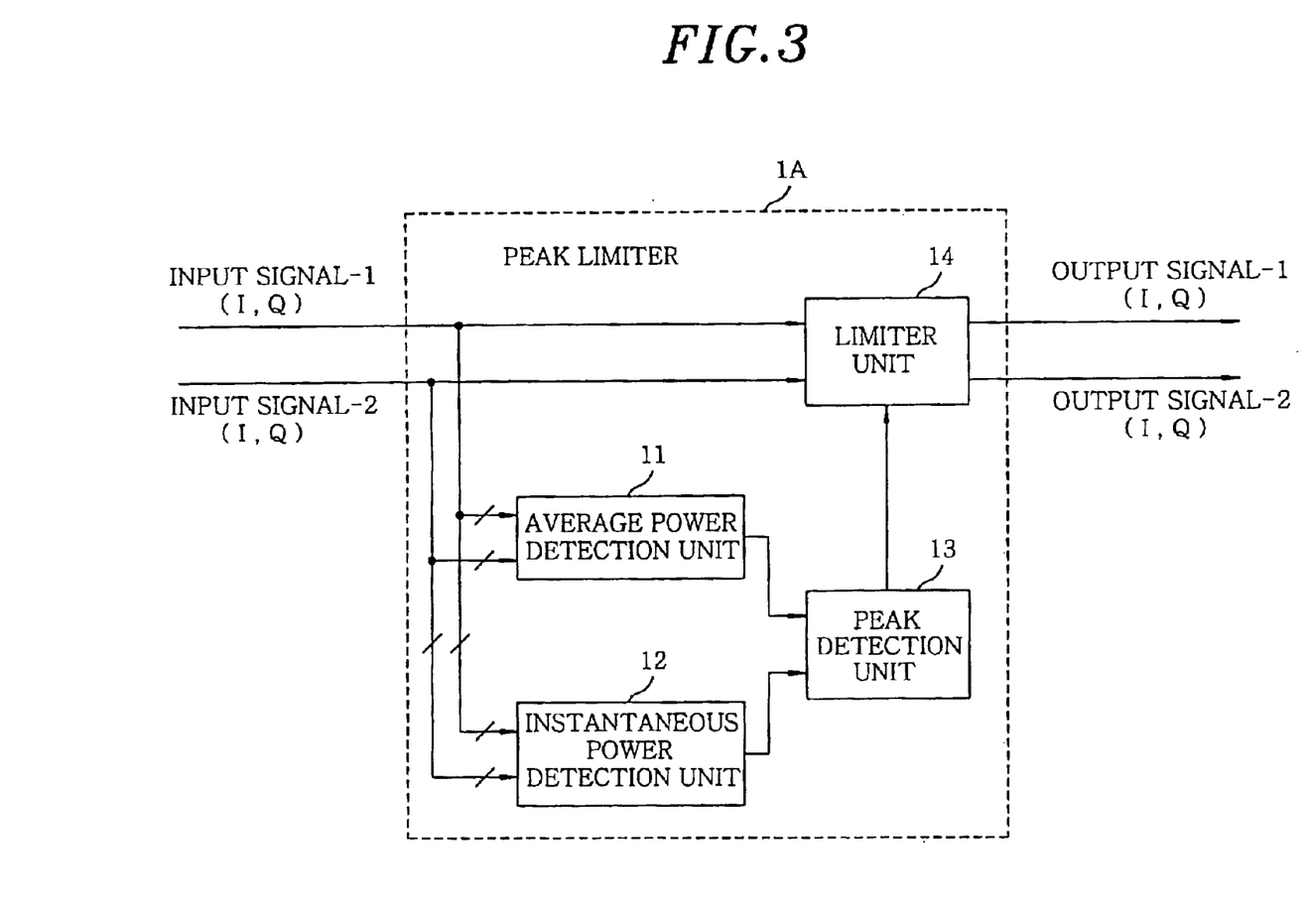
FIG. 3 sets forth a block diagram of a peak limiter in accordance with a first preferred embodiment of the present invention.

Referring to FIG. 3, there is shown a block diagram of a peak limiter 1A in accordance with a first preferred embodiment of the present invention, wherein like reference numerals are used to denote like parts of the conventional peak limiter 1' shown in FIG. 10.

The peak limiter 1A in accordance with the first preferred embodiment of the present invention includes an average power detection unit 11, an instantaneous power detection unit 12, a peak detection unit 13 and a limiter unit 14 as shown in FIG. 3. The peak limiter 1A is implemented by functional units similar to those of the conventional peak limiter 1' shown in FIG. 10. However, the operation and function of each unit of peak limiter 1A differ from those of corresponding unit of the conventional peak limiter 1'.

Each unit of the peak limiter 1A will now be described in detail.

The average power detection unit 11 receives input signals (I, Q) of a multiplicity of carriers (two carriers are assumed in FIG. 3) in order to computationally estimate and detect an average power level of a multi-carrier signal to be produced by the coupler 4 (FIG. 1) in case no peak limitation is performed with respect to the input signals. The detailed explanation of estimating the average power level of the multi-carrier signal will be described hereinafter.

The instantaneous power detection unit 12 also receives the input signals (I, Q) to detect instantaneous power levels of the estimated multi-carrier signal. The detailed explanation of estimating the instantaneous power levels of the multi-carrier signal will also be described hereinafter.

The peak detection unit 13 detects whether there exists a peak to be power-limited in the estimated multi-carrier signal. Specifically, the peak detection unit 13 calculates instantaneous-to-average power ratios of the estimated multi-carrier signal, an instantaneous-to-average power ratio being the ratio of an instantaneous power level detected by the instantaneous power detection unit 12 to an average power level detected by the average power detection unit 11. Then, the peak detection unit 13 detects whether there exists any instantaneous-to-average power ratio exceeding a predetermined peak factor threshold value. The portions of the estimated multi-carrier signal having an instantaneous-to-average power ratio exceeding the peak factor threshold value is determined as a peak to be power-limited and outputted as peak detection information to the limiter unit 14. The predetermined peak factor threshold value is obtained based on the peak factor used in determining the operating point for a saturation output power level of the amplifier shown in FIG. 7B.

The peak detection unit 13 in accordance with the present invention carries out peak detection with respect to the computationally estimated multi-carrier signal. However, the peak detection operation thereof is also carried out based on the input average and instantaneous power information, as in the conventional peak detection unit 13' shown in FIG. 10.

The limiter unit 14 receives the input signals (I, Q) to limit a peak of the amplitude of each input signal (I, Q) To be specific, depending on the peak detection information, i.e., when a peak to be limited is detected in the estimated multi-carrier signal by the peak detection unit 13, the power of each input signal is limited to become below a predetermined peak factor, thereby generating an output signal (I, Q).

The methods carried out in the average and the instantaneous power detection units 11 and 12 in order to estimate the multi-carrier signal having carrier signals combined in the RF band will now be described.

In a first estimation method for computationally approximating the multi-carrier signal having carriers combined in the RF band, the input signals provided to the average and the instantaneous power detection unit 11 and 12 are multiplexed with a frequency offset $\Delta f$ therebetween, the frequency offset $\Delta f$ being equal to the difference between carrier frequencies to be given to the actual carriers c1 and c2 at the up-converters 3-1 and 3-2. That is, each input signal is modulated to have an adjusted-carrier frequency being equal to $cf_t - cf_0$, $cf_t$ being an actual carrier frequency of an input signal to be modulated and $cf_0$ being a lowest actual carrier frequency, and then the modulated input. signals are combined. Thereafter, the power of the combined input signal is detected at every constant sampling interval.

The input signals inputted to the average and the instantaneous power detection unit 11 and 12 are originally baseband signals (I, Q). Thus, the estimation of the multi-carrier signal in RF band may be performed by up-converting the input signals to have actual RF carrier frequencies, by combining or coupling the up-converted signals and by measuring the power of the coupled signals. Signal processing in an RF frequency band, however, requires a very fast sampling frequency, necessitating a costly signal processing device.

However, assuming carrier frequencies having a constant frequency offset $\Delta f$ between every two neighboring carrier frequencies, it is possible to estimate the multi-carrier signal at a low frequency band. That is, by combining the input signals after providing thereto the frequency offset $\Delta f$ therebetween and then sampling the power of the sum of the carriers with a sampling frequency, e.g., corresponding to the lowest carrier frequency, it is possible to approximate the instantaneous powers and the average power of the actual multi-carrier signal.

The power detection schemes employed in the conventional power detection units 11' and 12' shown in FIG. 10 as well as in the average and the instantaneous power detection unit 11 and 12 in accordance with the present invention will be described.

First, each input signal $S_1$ (I, Q) may be represented by using the vector complex notation as follows:

$$S_1 = I_1(t) + jQ_1(t) \ (i=1, 2, \ldots n) \quad \text{Eq. (1).}$$

Then, the average power obtained from the average power detection unit 11' and the instantaneous power obtained by the instantaneous power detection unit 12' in a conventional peak limiter 1'-1 or 1'-2 of the conventional multi-carrier amplification apparatus shown in FIG. 10 can be represented as:

Instantaneous power=pow($S_1$)=$I_1(t)^2+Q_1(t)^2$

Average power=$\Sigma\{\text{pow}(S_1)\}$ ($i=1$ to $n$)      Eq. (2).

A method to obtain the average power may include a moving average method or a weighed average method, but is not limited thereto.

On the other hand, the average and the instantaneous powers obtained from the average and the instantaneous power detection units 11 and 12 in the peak limiter 1A shown in FIG. 3 by using the first estimation method in accordance with the present invention can be represented as:

Instantaneous power=pow($S_1+S_2*e^{j2\pi\cdot\Delta ft}+S_3*e^{j2\pi\cdot2\Delta ft}+S_4*e^{j2\pi\cdot3\Delta ft}+\ldots$)

Average power=$\Sigma\{\text{pow}(S_1+S_2*e^{j2\pi\cdot2\Delta ft}+S_3*e^{j2\pi\cdot2\Delta ft}+S_4*e^{j2\pi\cdot3\Delta ft}+\ldots)\}$(3)

wherein $\Delta f$ is the carrier frequency offset between neighboring carriers.

As described above, assuming that the respective input signals are up-converted to RF band with the frequency offset $\Delta f$ between two neighboring RF frequencies, the input signals are multiplexed with the frequency offset $\Delta f$ and then are combined to computationally approximate the multi-carrier signal to be actually produced by coupling the carrier signals in the RF band.

In addition, if the average power is detected for a long time by using the constant sampling interval, e.g., corresponding to one period of the lowest carrier frequency, an average power level almost similar to an actual average power level multiplexed or combined in the RF frequency band can be obtained despite a large sampling interval.

As for the instantaneous power, if the respective input signals are multiplexed with the frequency offset $\Delta f$ and then combined, an instantaneous power of the multi-carrier signal can become great to have a peak in case the phases of the carrier signals are coincident with each other as shown in FIG. 2D. Thus, if the instantaneous power is detected by sampling the power at such moments, the estimated instantaneous power required in peak limiting the multi-carrier signal can be obtained.

Figure 4:
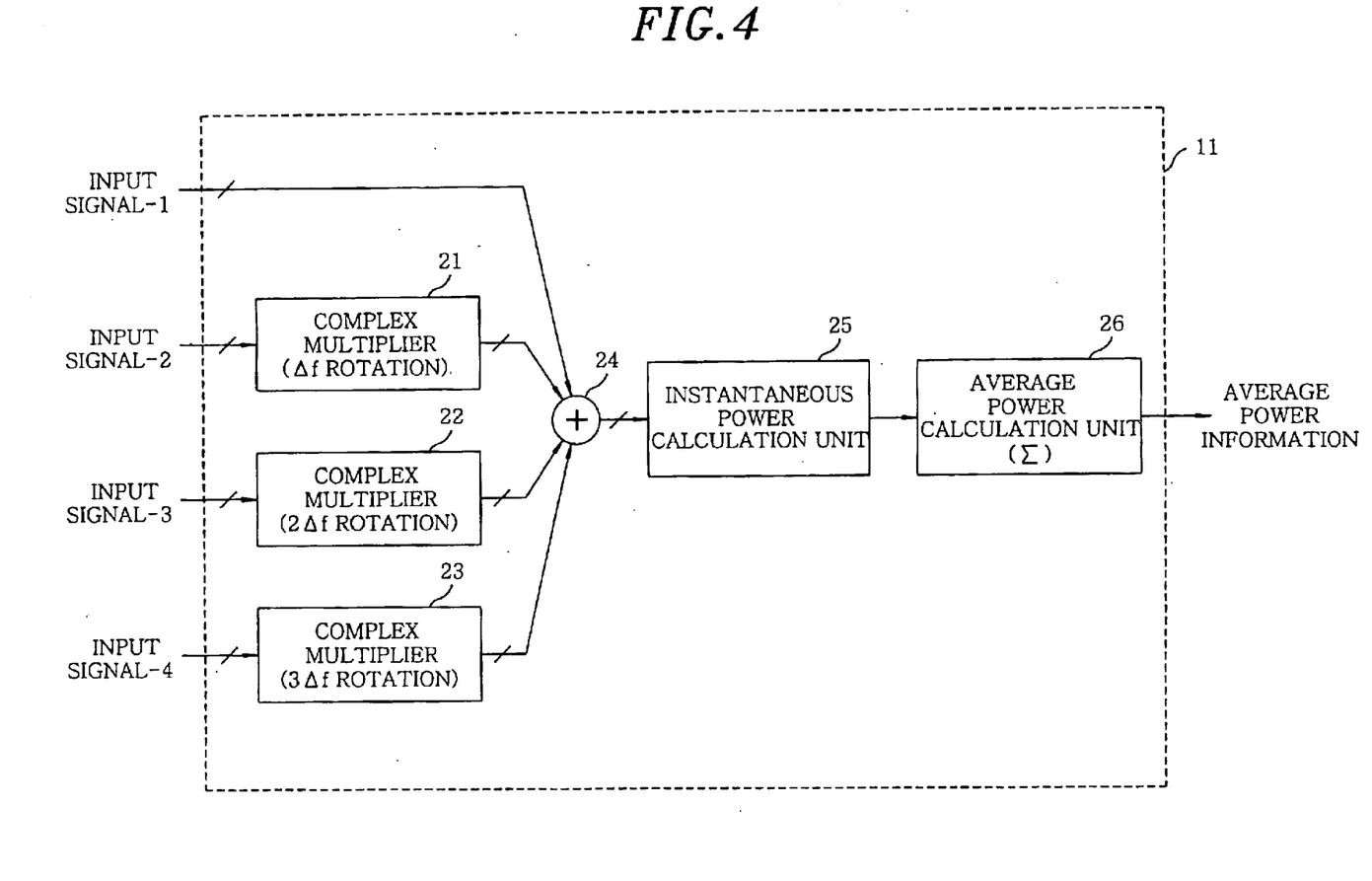
FIG. 4 presents a block diagram of an average power detection unit shown in FIG. 3.
Figure 5:
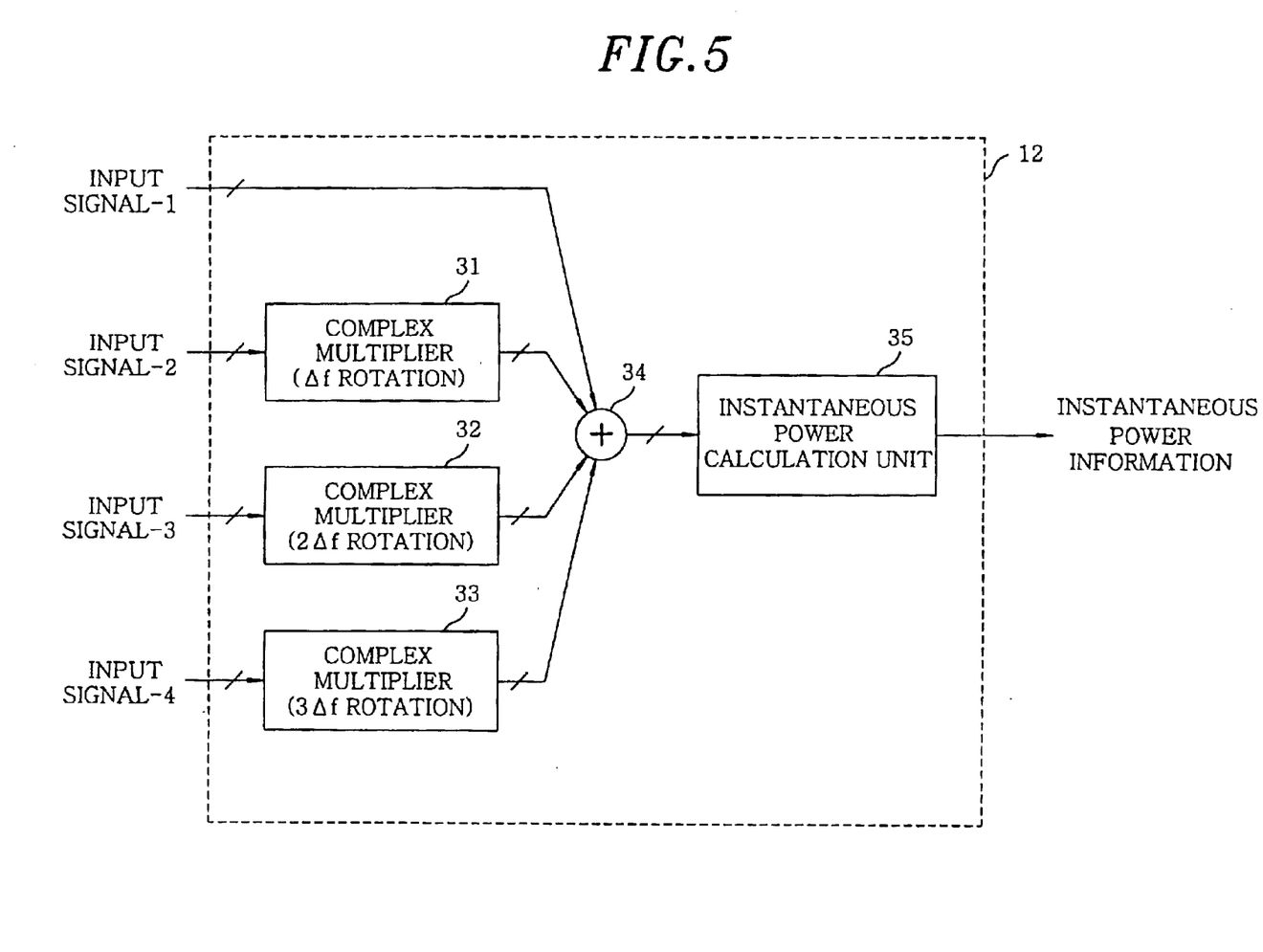
FIG. 5 depicts a block diagram of an instantaneous power detection unit shown in FIG. 3.

Referring to FIGS. 4 and 5, there are illustrated configurations of the average and the instantaneous power detection unit 11 and 12 for realizing the above first estimation method. FIG. 4 presents a block diagram of the average power detection unit 11 and FIG. 5 depicts a block diagram of the instantaneous power detection unit 12. In FIGS. 4 and 5, it is assumed for an illustrative purpose only that the multi-carrier signal contains four carriers and therefore there exist four inputs therefor. The number of carriers (and input signals), however, can be any positive number greater than one as will be appreciated by those skilled in the art.

The average power detection unit 11 for realizing the first estimation method includes complex multipliers 21 to 23, an adder 24, an instantaneous power calculation unit 25 and an average power calculation unit 26, as shown in FIG. 4.

The average power detection unit 11 receives the input signals −1 to −4. To be more specific, the input signal −1 is provided directly to the adder 24 as it is. The input signal −2 is provided with an offset rotated by $\Delta f$ at the complex multiplier 21. The input signal −3 is provided with an offset rotated by $2\Delta f$ at the complex multiplier 22. The input signal −4 is provided with an offset rotated by $3\Delta f$ at the complex multiplier 23. All offset signals from the complex multipliers 21 to 23 are also fed to the adder 24 and summed up together with the input signal −1. Next, the instantaneous power calculation unit 25 calculates instantaneous power levels of the added signal from the adder 24. Then, the average power calculation unit 26 calculates the average power level of the added signal based on the instantaneous power levels from the instantaneous power calculation unit 25.

In the same way, the instantaneous power detection unit 12 for realizing the above first estimation method in accordance with the present invention includes a complex multiplier 31 to 33, an adder 34 and an instantaneous power calculation unit 35 as shown in FIG. 5.

The parts 31 to 35 of the instantaneous power detection unit 12 shown in FIG. 5 are functionally identical to those of corresponding parts 21 to 25 of the average power detection unit 11 shown in FIG. 4. Therefore, the parts 31 to 35 can be shared by both units 11 and 12 and parts 21 to 25 of the average power detection unit 11 can be omitted. In that case, the output from the instantaneous power calculation unit 12 can be provided to the average power calculation unit 26 as the instantaneous power information to enable the average power detection unit 11 to calculate the average power of the added signal.

An alternative method for approximating the instantaneous and the average power levels of the estimated multi-carrier signal will now be described.

In a second estimation method for computationally estimating the multi-carrier signal, the input signals are treated as vectors, so that an average power is obtained by combining the input signals by using a vector operation and a power at a moment when an instantaneous power of the combined signal (vector) is maximized is also obtained by the vector operation.

First, a method for obtaining the average power in accordance with the second estimation method will now be described.

In the multi-carrier amplification apparatus shown in FIG. 1, the input baseband signals (I, Q) are peak-limited at the peak limiter 1, modulated by the up-converters 3-1 and 3-2 after being low pass filtered at LPF 2-1 and 2-2, and combined at the coupler 4 to produce the multi-carrier signal. Therefore, the estimation of the multi-carrier signal in RF band may be performed in principle by up-converting the input signals to have RF carrier frequencies, by combining or coupling the up-converted signals and by measuring the power of the coupled signals. However, signal processing in an RF frequency band requires a very fast sampling frequency, necessitating a costly signal processing device.

Thus, in accordance with the second estimation method, each input baseband signal is treated as a vector. Then, sampling the input signals is performed at regular time intervals to perform the operation of combining the vectors, and, thereafter, the average of the power of the combined vectors is obtained as the average power of the estimated multi-carrier signal.

Next, a method for obtaining the instantaneous power in accordance with the second estimation method will be now described.

The estimation of the instantaneous power in the RF frequency band also requires a very fast sampling frequency, necessitating a costly signal processing device as in the case of obtaining the average power.

Thus, the sum of the powers of the respective baseband signals is obtained at a timing when the respective carrier signals become inphase. Then, the sum of the powers of the baseband signals is provided as the estimated instantaneous power of the multi-carrier signal synthesized in RF band.

That is because the power level of the multi-carrier signal becomes large as the carrier signals become more inphase and can become locally maximal in case the phases of the carrier signals are all coincident as shown in FIG. 2D. Consequently, by detecting the instantaneous power of the multi-carrier signal at such timing, the peak limiting thereof can be effectively carried out. At such timing, the power of the combined vectors is equal to the sum of the powers of the respective input signals.

For example, in case of W-CDMA, a bandwidth of one channel of input signal is 3.84 MHz with a carrier offset of 5 MHz, so that there occur instances at which vectors of a plurality of carriers are parallelized.

The method for obtaining the instantaneous and the average power levels of the estimated multi-carrier signal in accordance with the second estimation method will now be described in more detail.

As described in the first estimation method, assuming carrier frequencies having a constant frequency offset $\Delta f$ between two neighboring carrier frequencies, it is possible to estimate the multi-carrier signal at a low frequency band. That is, by combining the input signals provided with the frequency offset $\Delta f$ therebetween, it is possible to approximate the instantaneous and the average power levels of the actual multi-carrier signal as in Eq. (3).

If sampling is carried out only at the moments when the exponential terms of the vectors are the same with $1+j\cdot 0$ being equal to 1, the average power in Eq. (3) reduces to that in Eq. (4) as follows, which exhibits an average power of the combined vectors of the input baseband signals.

$$\begin{aligned}\text{Instantaneous power} &= pow(S_1) + pow(S_2) + pow(S_3) + \ldots \\ &= (I_1(t)^2 + Q_1(t)^2) + (I_2(t)^2 + Q_2(t)^2) + \\ &\quad (I_3(t)^2 + Q_3(t)^2) + \ldots \\ \text{Average power} &= \sum \{pow(S_1 + S_2 + S_3 + S_4 + \ldots )\} \\ &= \sum (\{I_1(t) + I_2(t) + I_3(t) + \ldots\}^2 + \\ &\quad \{Q_1(t) + Q_2(t) + Q_3(t) + \ldots\}^2)\end{aligned} \quad \text{Eq. (4)}$$

Even though the average power in Eq. (4) implies a rough sampling, the average power of the combined vectors defined in Eq. (4) becomes almost similar to that of the first estimation method by performing the sampling of the average power of the combined vectors for a long time, so that the hardware structure can become simpler by using the second estimation method.

The instantaneous power in Eq. (4) is represented by the sum of the input signals obtained when the phases of the input signals are coincident with each other.

As described above, the average and the instantaneous power levels are obtained based on the first or the second estimation method of the present invention described in terms of Eqs. (3) and (4) at the average and the instantaneous power detection units 11 and 12. The peak detection unit 13 then calculates instantaneous-to-average power ratios of the estimated multi-carrier signal and determines the portions of the multi-carrier signal having instantaneous-to-average power ratios exceeding the peak threshold value as a peak to be power-limited. Portions of input signals corresponding to such peaks of the multi-carrier signal are power-limited by the limiter unit 14. Therefore, since the peak factors of the input signals are limited based on the estimated multi-carrier signal, the actual multi-carrier signal can be efficiently peak-limited without suffering from unnecessary and unduly large peak limitation frequently encountered in the prior art peak limitation scheme.

Thus, the modulation accuracy of carriers can be improved and the operating point of the amplifier can be raised to enhance the power efficiency thereof in accordance with the peak limitation scheme of the present invention.

An operating point of the W-CDMA system, however, dynamically varies while controlling the transmission power. In such a case, there can be occasions when the amplifier does not operate in the saturation region even with a large peak factor if an operating point is low.

Figure 9:
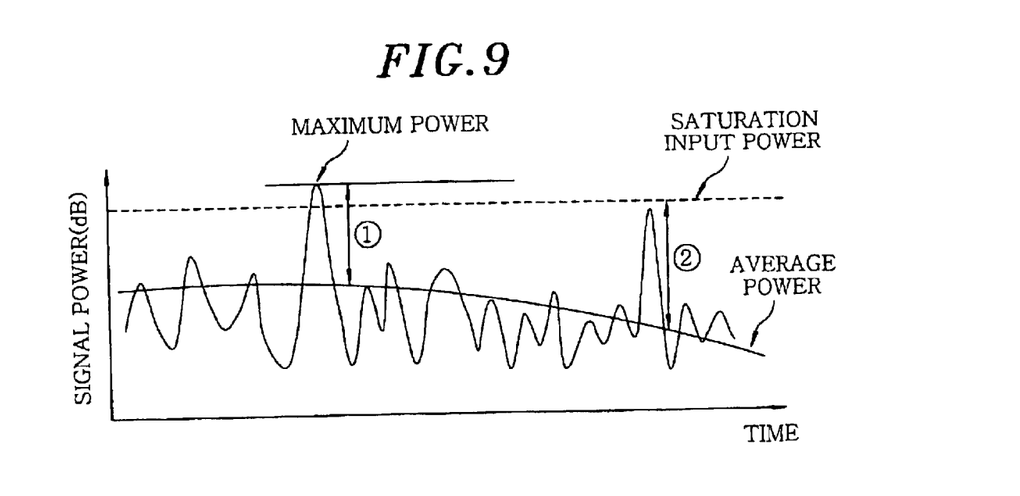
FIG. 9 shows a diagram for illustrating a case where an instantaneous power not exceeding a saturation input power level has an instantaneous-to-average power ratio greater than a predetermined peak threshold value.

Referring to FIG. 9, there is shown a diagram for illustrating an exemplary case where an input signal has a peak factor exceeding a predetermined peak factor threshold value but with a peak power lower than the saturation input power level.

In case of ①, the maximum power level of an input signal to an amplifier exceeds a saturation input power level and a peak factor thereof exceeds the peak factor threshold value. In case of ②, on the other hand, the maximum power level of the signal is below the saturation input power level but a peak factor thereof exceeds the peak factor threshold value. In accordance with the first preferred embodiment of the present invention, the peak limitation in case of ① can be properly performed by suppressing the signal not to have a peak factor greater than the peak factor threshold value. In case of ②, however, if the peak limitation is performed in terms of the peak factor threshold value as in the first preferred embodiment when the operating point is low, there occurs a problem that even a peak less than the saturation input power level can be unnecessarily peak-limited.

Figure 6:
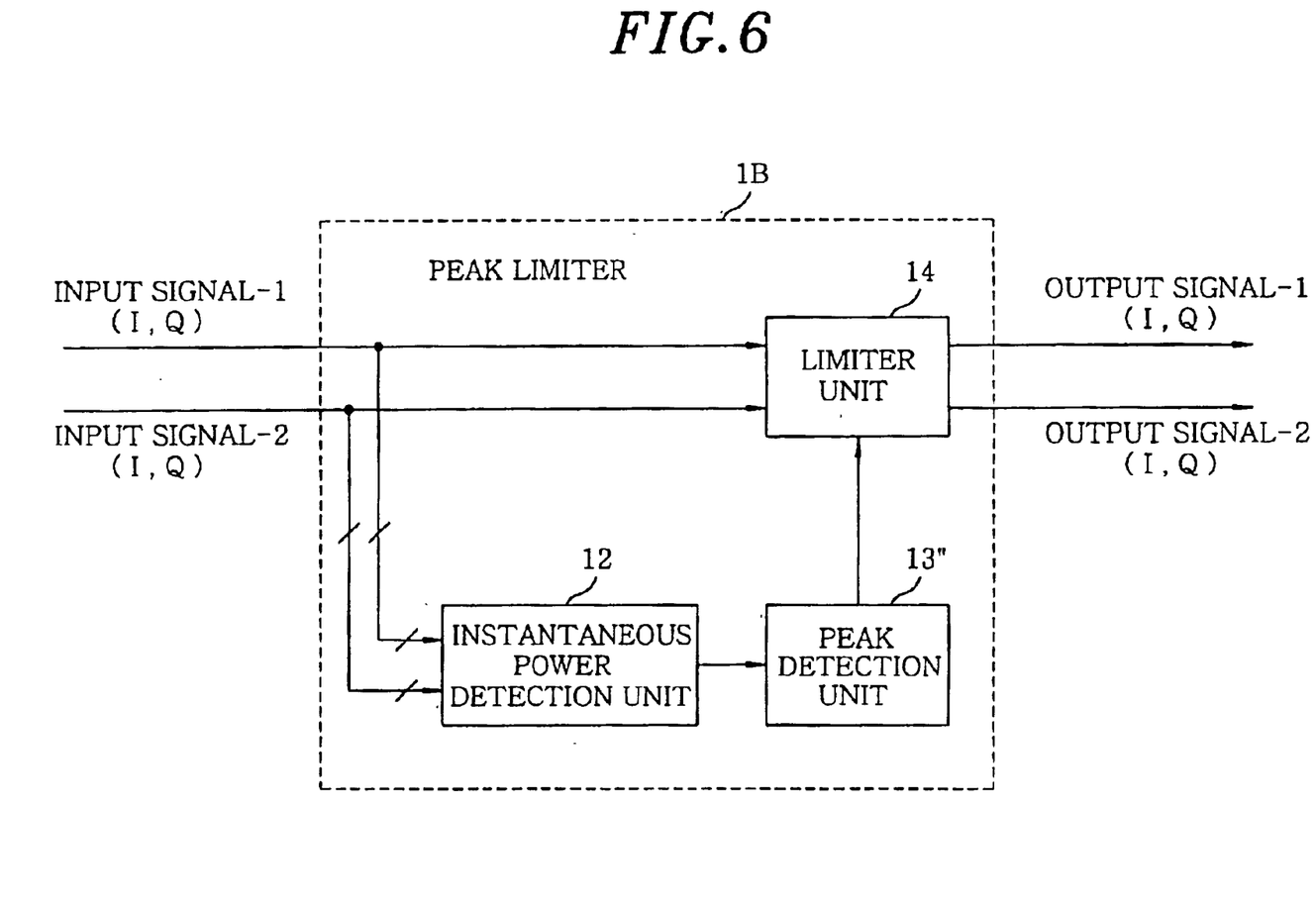
FIG. 6 shows a block diagram of a peak limiter in accordance with a second preferred embodiment of the present invention.

Referring to FIG. 6, there is shown a block diagram of a peak limiter 1B in accordance with a second preferred embodiment of the present invention, which is capable of resolving such a problem of unnecessary peak limitation in the first preferred embodiment. Like reference numerals are used to denote and identify corresponding or identical elements of the peak limiter 1A in FIG. 3.

The peak limiter 1B in accordance with the second preferred embodiment of the present invention includes an instantaneous power detection unit 12, a peak detection unit 13" and a limiter unit 14 as shown in FIG. 6. The peak limiter 1B is basically identical to the peak limiter 1A shown in FIG. 3, excepting that the peak limiter 1B is devoid of the average power detection unit 11; and is implemented by similar functional units to those of the peak limiter 1A. However, the operation and function of the peak detection unit 13" of the peak limiter 1B slightly differ from those of corresponding unit of the peak limiter 1A.

Each unit of the peak limiter 1B will now be described in detail.

The instantaneous power detection unit 12 receives the input signals (two carriers are assumed in FIG. 6) to detect instantaneous power of the computationally estimated multi-carrier signal in an identical manner as described above in the first preferred embodiment. The instantaneous power detection unit 12 is identical to that of a peak limiter 1A and thus will not be repeatedly described.

The peak detection unit 13" detects whether there exists a peak of the estimated multi-carrier signal. Specifically, the peak detection unit 13" detects whether there exists any instantaneous power level from the instantaneous power detection unit 12 exceeding a predetermined peak threshold value. The portions of the instantaneous power levels of the estimated multi-carrier signal exceeding the peak threshold value are determined as a peak to be power-limited and outputted as peak detection information to the limiter unit 14. The predetermined peak threshold value is obtained based on the saturation input power level of the amplifier shown in FIG. 7B.

The limiter unit 14 receives the input signals (I, Q) to limit a peak of the amplitude of the each input signal (I, Q) To be specific, the power of each input signal is limited to a predetermined limit power to generate an output signal (I, Q), depending on the peak detection information, i.e., when a peak to be limited is detected in the estimated multi-carrier signal by the peak detection unit 13".

The peak detection unit 13" in accordance with the second embodiment of the present invention detects whether there exists any instantaneous power level of the estimated multi-carrier signal exceeding the peak threshold value.

Accordingly, in case the instantaneous-to-average power ratio exceeds the peak threshold value, but instantaneous input power level is below the saturation input power level, no peak limitation is performed. Thus, the distortion generated by performing the unnecessary peak limitation which can occur in the first preferred embodiment can be effectively prevented and the circuit can be simpler because no average power detection unit is required. Further, the operational burden can also be reduced to thereby improve the reliability of the entire system.

While the invention has been shown and described with respect to the preferred embodiments, it will be understood by those skilled in the art that various changes and modifications may be made without departing from the spirit and scope of the invention as defined in the following claims.

What is claimed is:

1. A peak limiter for use in a system for amplifying a multi-carrier signal, comprising:
    an instantaneous power detection unit for receiving a baseband signal of each carrier and estimating the multi-carrier signal to provide instantaneous power levels of the estimated multi-carrier signal;
    an average power detection unit for providing an average power level of the estimated multi-carrier signal;
    a peak detection unit, responsive to the average power level and the instantaneous power levels, for calculating instantaneous-to-average power ratios, an instantaneous-to-average power ratio being a ratio of an instantaneous power level to the average power level, and comparing the instantaneous-to-average power ratios with a predetermined peak factor threshold value to thereby detect a peak to be peak-limited and provide peak detection information representing the peak; and
    a limiter unit for limiting an amplitude of the baseband signal in response to the peak detection information to provide peak-limited baseband signals, wherein the estimated multi-carrier signal is obtained by combining baseband signals of carriers after providing the baseband signals with frequency offsets which correspond to differences between carrier frequencies.

2. The peak limiter of claim 1, wherein the average power detection unit provides the average power level by combining vectors of respective baseband signals of carriers to obtain combined vectors and then calculating an average of powers of the combined vectors.

3. The peak limiter of claim 2, wherein the instantaneous power levels are obtained by calculating the sum of power levels of baseband signals of carriers when carrier signals are in phase.

4. A multi-carrier amplification apparatus for amplifying a multi-carrier signal, comprising:
    a peak limiter of claim 3;
    a filter for filtering the peak-limited baseband signals from the peak limiter to provide filtered signals;
    a up-converter for up-converting the filtered signals to a radio frequency RF band to provide up-converted carrier signals;
    a coupler for combining the up-converted signals to output a multi-carrier signal; and
    an amplifier for amplifying the multi-carrier signal.

5. A multi-carrier amplification apparatus for amplifying a multi-carrier signal, comprising:
    a peak limiter of claim 2;
    a filter for filtering the peak-limited baseband signals from the peak limiter to provide filtered signals;
    a up-converter for up-converting the filtered signals to a radio frequency RF band to provide up-converted carrier signals;
    a coupler for combining the up-converted signals to output a multi-carrier signal; and
    an amplifier for amplifying the multi-carrier signal.

6. The peak limiter of claim 1, wherein the instantaneous power levels are obtained by calculating the sum of power levels of baseband signals of carriers when carrier signals are in phase.

7. A multi-carrier amplification apparatus for amplifying a multi-carrier signal, comprising:
    a peak limiter of claim 6,
    a filter for filtering the peak-limited baseband signals from the peak limiter to provide filtered signals;
    a up-converter for up-converting the filtered signals to a radio frequency RF band to provide up-converted carrier signals;
    a coupler for combining the up-converted signals to output a multi-carrier signal; and
    an amplifier for amplifying the multi-carrier signal.

8. A multi-carrier amplification apparatus for amplifying a multi-carrier signal, comprising:
    a peak limiter of claim 1;
    a filter for filtering the peak-limited baseband signals from the peak limiter to provide filtered signals:
    a up-converter for up-converting the filtered signals to a radio frequency RF band to provide up-converted carrier signals;
    a coupler for combining the up-converted signals to output a multi-carrier signal; and
    an amplifier for amplifying the multi-carrier signal.

9. A peak limiter for use in a system for amplifying a multi-carrier signal, comprising:
    an instantaneous power detection unit for receiving a baseband signal of each carrier and estimating the multi-carrier signal to provide instantaneous power levels of the estimated multi-carrier signal;
    a peak detection unit, responsive to the instantaneous power levels, for comparing the instantaneous power levels with a predetermined peak threshold value to thereby detect a peak to be peak-limited and providing peak detection information representing the peak; and
    a limiter unit for limiting an amplitude of the baseband signal in response to the peak detection information to provide peak-limited baseband signals, wherein the estimated multi-carrier signal is obtained by combining baseband signals of carriers after providing the baseband signals with frequency offsets which correspond to differences between carrier frequencies.

10. The peak limiter of claim 9, wherein the instantaneous power levels are obtained by calculating the sum of power levels of baseband signals of carriers when carrier signals are in phase.

11. A multi-carrier amplification apparatus for amplifying a multi-carrier signal, comprising:

a peak limiter of claim 10;

a filter for filtering the peak-limited baseband signals from the peak limiter to provide filtered signals;

a up-converter for up-converting the filtered signals to a radio frequency RF band to provide up-converted carrier signals;

a coupler for combining the up-converted signals to output a multi-carrier signal; and an amplifier for amplifying the multi-carrier signal.

12. A multi-carrier amplification apparatus for amplifying a multi-carrier signal, comprising:

a peak limiter of claim 9;

a filter for filtering the peak-limited baseband signals from the peak limiter to provide filtered signals;

a up-converter for up-converting the filtered signals to a radio frequency RF band to provide up-converted carrier signals;

a coupler for combining the up-converted signals to output a multi-carrier signal; and an amplifier for amplifying the multi-carrier signal.

* * * * *